(12) United States Patent
Avci et al.

(10) Patent No.: US 11,799,029 B2
(45) Date of Patent: **\*Oct. 24, 2023**

(54) MULTILAYER INSULATOR STACK FOR FERROELECTRIC TRANSISTOR AND CAPACITOR

(71) Applicant: Intel Corporation, Santa Clara, CA (US)

(72) Inventors: Uygar E. Avci, Portland, OR (US); Joshua M. Howard, Portland, OR (US); Seiyon Kim, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/551,899

(22) Filed: Dec. 15, 2021

(65) Prior Publication Data

US 2022/0123151 A1    Apr. 21, 2022

Related U.S. Application Data

(63) Continuation of application No. 16/640,043, filed as application No. PCT/US2017/054592 on Sep. 29, 2017, now Pat. No. 11,239,361.

(51) Int. Cl.
*H01L 29/78* (2006.01)
*H01L 29/51* (2006.01)
(Continued)

(52) U.S. Cl.
CPC ........ *H01L 29/78391* (2014.09); *H01L 28/56* (2013.01); *H01L 29/513* (2013.01);
(Continued)

(58) Field of Classification Search
CPC ............. H01L 29/78391; H01L 29/513; H01L 29/516; H01L 29/517; H01L 29/785;
(Continued)

(56) References Cited

U.S. PATENT DOCUMENTS 6,233,169 B1    5/2001   Nishimura
6,707,082 B2    3/2004   Haneder et al.
(Continued)

FOREIGN PATENT DOCUMENTS

KR    20070016472    2/2007

OTHER PUBLICATIONS

U.S. Appl. No. 16/640,043, filed Feb. 18, 2020, Pending.
(Continued)

*Primary Examiner* — Jose R Diaz
(74) *Attorney, Agent, or Firm* — Finch & Maloney PLLC

(57) ABSTRACT

Described is an apparatus which comprises: a first layer comprising a semiconductor; a second layer comprising an insulating material, the second layer adjacent to the first layer; a third layer comprising a high-k insulating material, the third layer adjacent to the second layer; a fourth layer comprising a ferroelectric material, the fourth layer adjacent to the third layer; and a fifth layer comprising a high-k insulating material, the fifth layer adjacent to the fourth layer.

20 Claims, 8 Drawing Sheets

(51) Int. Cl.
  *H10B 51/30* (2023.01)
  *H10B 53/30* (2023.01)
  *H01L 49/02* (2006.01)
(52) U.S. Cl.
  CPC .......... *H01L 29/516* (2013.01); *H01L 29/517* (2013.01); *H01L 29/785* (2013.01); *H10B 51/30* (2023.02); *H10B 53/30* (2023.02)
(58) Field of Classification Search
  CPC ......... H01L 28/56; H10B 51/00; H10B 51/30; H10B 53/00; H10B 53/30
  See application file for complete search history.

(56) References Cited

U.S. PATENT DOCUMENTS

| 11,239,361 | B2* | 2/2022 | Avci ................. H01L 29/78391 |
| 2002/0167086 | A1 | 11/2002 | Stauf et al. |
| 2007/0045689 | A1 | 3/2007 | Lim et al. |
| 2010/0195369 | A1 | 8/2010 | Zhao |
| 2010/0314679 | A1 | 12/2010 | Lee |
| 2016/0064391 | A1 | 3/2016 | Li et al. |
| 2017/0162587 | A1 | 6/2017 | Chavan et al. |
| 2019/0074295 | A1 | 3/2019 | Schroder |
| 2020/0235243 | A1 | 7/2020 | Avci et al. |

OTHER PUBLICATIONS

PCT/US17/54592, Sep. 29, 2017, Expired.
International Search Report and Written Opinion received for PCT/US2017/054592, dated Jun. 11, 2018. 14 pages.
International Preliminary Report on Patentability received for PCT/US2017/054592, dated Apr. 9, 2020. 11 pages.

* cited by examiner

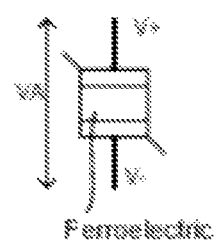
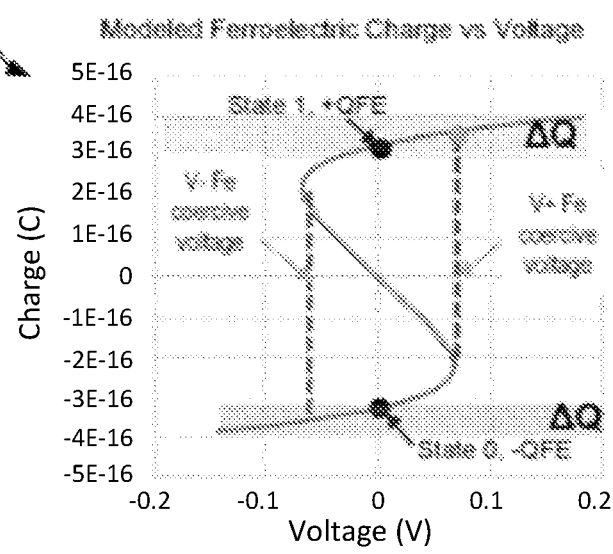
Fig. 9A
Fig. 9B

MULTILAYER INSULATOR STACK FOR FERROELECTRIC TRANSISTOR AND CAPACITOR

CROSS-REFERENCE TO RELATED APPLICATIONS

This application is a continuation of U.S. application Ser. No. 16/640,043 filed Feb. 18, 2020, which is a National Stage Application of PCT/US2017/054592 filed Sep. 29, 2017, each of which is hereby incorporated herein by reference in its entirety.

BACKGROUND

Ferroelectric (FE) materials (such as Barium Strontium Titanate (BST), lead zirconate titanate (PST), lead titanate (PbTiO$_3$), lead lanthanaum zirconate titanate (PLZT), etc.) have been investigated for non-volatile logic applications such as embedded ultra-low power applications, energy scavenging systems, internet of things (IOT), etc. These FE materials exhibit spontaneous electric polarization that can be reversed by application of an electric field.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 9A illustrates a schematic of a FE-Cap comprising one or more layers shown in FIG. 5, according to some embodiments of the disclosure.

FIG. 9B illustrates a plot showing charge versus voltage function of the FE-Cap comprising one or more layers shown in FIG. 5, and its memory states, according to some embodiments of the disclosure.

DETAILED DESCRIPTION

Figure 1:
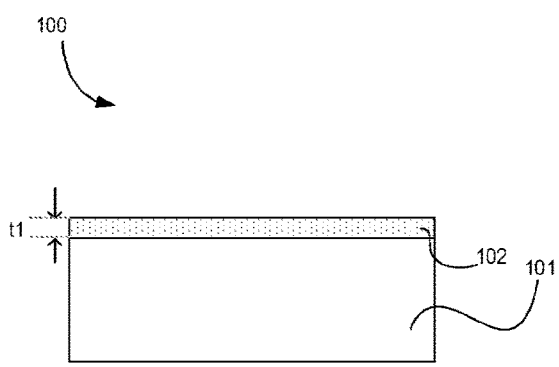
FIGS. 1-5 illustrate cross-sections of a material stack showing the formation of a ferroelectric (FE) stack on a semiconductor, according to some embodiments of the disclosure.
Figure 2:
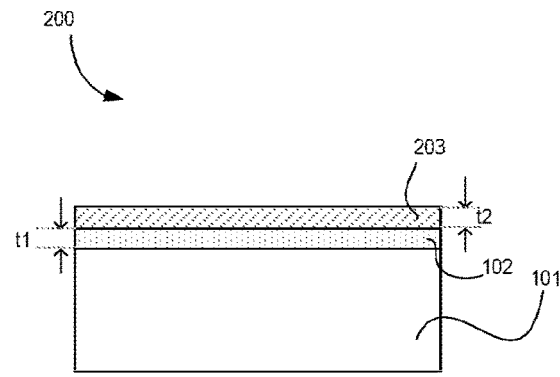
Figure 3:
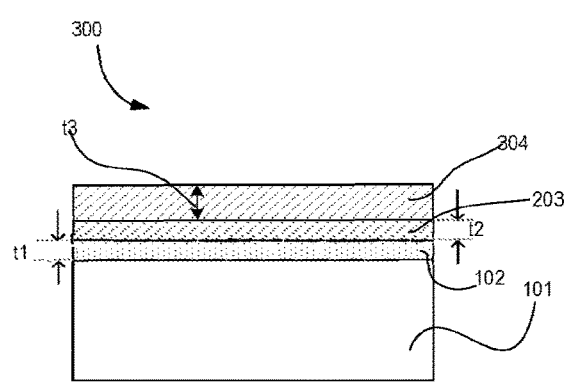
Figure 4:
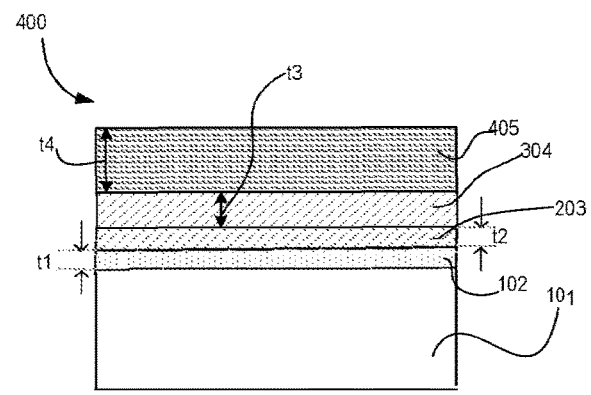

In some embodiments, a multi insulator and ferroelectric (FE) stack is provided which incorporates specific layers that target at controlling specific attributes of the stack. For example, layers that determine interface quality, control leakage, achieve polarization storage, etc. are stacked to provide a FE field effect transistor (FET) or FE capacitor (FE-cap) such as metal-insulator-metal (MIM) capacitor.

In some embodiments, an apparatus is provided which comprises a first layer comprising a semiconductor (e.g., one or more of: boron, aluminum, gallium, indium, nitrogen, phosphorous, arsenic, antimony, or bismuth). In some embodiments, the apparatus comprises a second layer comprising an insulating material (e.g., one or more of: Si, O, N, or Ge; or one or more of SiO, silicon oxynitride, or GeO), where the second layer is adjacent to the first layer. In some embodiments, the apparatus comprises: a third layer comprising a high-k insulating material (e.g., one or more of: Hf, Al, Zr, La, or O; or HfO$_2$, Al$_2$O$_3$, ZrO$_2$, or La$_2$O$_3$), where the third layer is adjacent to the second layer. In some embodiments, the apparatus comprises a fourth layer comprising a ferroelectric material, where the fourth layer is adjacent to the third layer.

In some embodiments, the FE material includes one or more of: HfZrO$_2$ (HZO), HfAlO, BaTiO$_3$ (BTO), barium strontium titanate (BST), BiFeO$_3$ (BFO), Si doped HfO$_2$, PbTiO$_3$ (PTO), SrTiO$_3$ (STO), Pb[Zr$_x$Ti$_{(1-x)}$]O$_3$ (PZT) where x is less than or equal to 1 and greater or equal to 0, or lead lanthanum zirconate titanate (PLZT). In some embodiments, the FE material comprises one or more of: Hf, Zr, Ba, Bi, Ti, Pb, Sr, Zr, or La. In some embodiments, the apparatus comprises a fifth layer comprising a high-k insulating material, where the fifth layer (e.g., Hf, Al, Zr, La, or O; or one or more of HfO$_2$, Al$_2$O$_3$, ZrO$_2$, or La$_2$O$_3$) is adjacent to the fourth layer. In some embodiments, the apparatus comprises a sixth layer including a metal (e.g., Cu, Al, Au, Ag, W, Co, or Graphene). In some embodiments, the second layer has a thickness in a range of 1 to 20 Angstroms, the third and fifth layers have a thickness in a range of 1 to 20 Angstroms, and the fourth layer has a thickness in a range of 20 to 100 Angstroms.

The apparatus of various embodiments result in an enhanced FE behavior that enables higher remnant polarization, endurance cycles, retention time, superior leakage, reliability, and interface quality. Other technical effects will be evident from the various embodiments and figures.

Some embodiments disclose a backend MIM capacitor comprising a FE material (e.g., FE-caps). In some cases, these FE-caps are super capacitors, in accordance with some embodiments. In some embodiments, the FE-caps are switched capacitors. In some embodiments, the backend structures comprising FE-caps enable switch capacitor power supplies for very low voltage generation. Some embodiments describe a patterned FE-cap array formed in an IC (integrated circuit) chip.

In the following description, numerous details are discussed to provide a more thorough explanation of the embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

It is pointed out that those elements of a figure having the same reference numbers (or names) as the elements of any other figure can operate or function in any manner similar to that described, but are not limited to such.

FIGS. 1-5 illustrate cross-sections 100, 200, 300, 400, and 500, respectively, of a material stack showing the formation of FE stack on a semiconductor, according to some embodiments of the disclosure. Cross-section 100 illustrates a semiconductor layer or region 101 adjacent to a surface or interface layer 102. In some embodiments, semiconductor layer or region 101 comprises any suitable semiconductor such as elements from the Group III-V of the Periodic Table, Si, or Ge. For example, semiconductor layer or region 101 includes one or more of: boron, aluminum, gallium, indium, nitrogen, phosphorous, arsenic, antimony, or bismuth. In some embodiments, surface or interface layer 102 is a high quality layer which includes an insulating material such as SiO, Silicon Oxynitride, or GeO. In some embodiments, the thickness (t1) of surface or interface layer 102 is the range of 1 Angstrom (A) and 20 A.

Cross-section 200 illustrates deposition of layer 203 over surface or interface layer 102, in accordance with some embodiments. In some embodiments, layer 203 is responsible for controlling leakage. In some embodiments, layer 203 is a high-K insulator which includes one or more of: Hf, Al, Zr, La, or O. In some embodiments, layer 203 includes one or more of: $HfO_2$, $Al_2O_3$, $ZrO_2$, $La_2O_3$, or $TiO_2$. In some embodiments, the thickness (t2) of layer 203 is the range of 1 A and 40 A.

Cross-section 300 illustrates deposition of layer 304 over layer 203. In some embodiments, layer 304 is a FE layer which is responsible for large polarization at high electric fields. In some embodiments, layer 304 includes ferroelectric material which includes one or more of: $HfZrO_2$ (HZO), HfAlO, $BaTiO_3$ (BTO), barium strontium titanate (BST), $BiFeO_3$ (BFO), Si doped $HfO_2$, $PbTiO_3$ (PTO), $SrTiO_3$ (STO), $Pb[Zr_xTi_{(1-x)}]O_3$ (PZT) where x is less than or equal to 1 and greater or equal to 0, or lead lanthanum zirconate titanate (PLZT). In some embodiments, layer 304 includes one or more of: Hf, Zr, Ba, Bi, Ti, Pb, Sr, Zr, or La. In some embodiments, the thickness (t3) of layer 304 is the range of 20 A and 100 A. A typical thickness for layer 304 is 60 A, in accordance with some embodiments.

Cross-section 400 illustrates deposition of layer 405 over layer 304. In some embodiments, layer 405 is similar in material as layer 203. For example, layer 304 includes a low-leakage high-k dielectric material. In some embodiments, layer 405 is deposited to improve reliability of layer 304. For example, layer 405 isolates FE layer 304 from a metal layer that provides a contact to the FE layer 304. In some embodiments, layer 405 includes one or more of: Hf, Al, Zr, La, or O. In some embodiments, layer 405 includes one or more of: $HfO_2$, $Al_2O_3$, $ZrO_2$, $La_2O_3$, or $TiO_2$ In some embodiments, the thickness (t4) of layer 203 is the range of 1 A and 20 A.

Cross-section 500 illustrates a stack after metal layer 506 is deposited over layer 405. In some embodiments, metal layer 506 provides a contact to the FE capacitance. The thickness (t5) of layer 506 can be the thickness of the first metal (e.g., metal zero M0, metal one M1) or a gate metal height of a process technology node. In some embodiments, metal of layer 506 includes one or more of: N, Ti, Cu, Al, Au, Ag, W, Co, or Graphene, TiN, TaN, or Ta.

Figure 5:
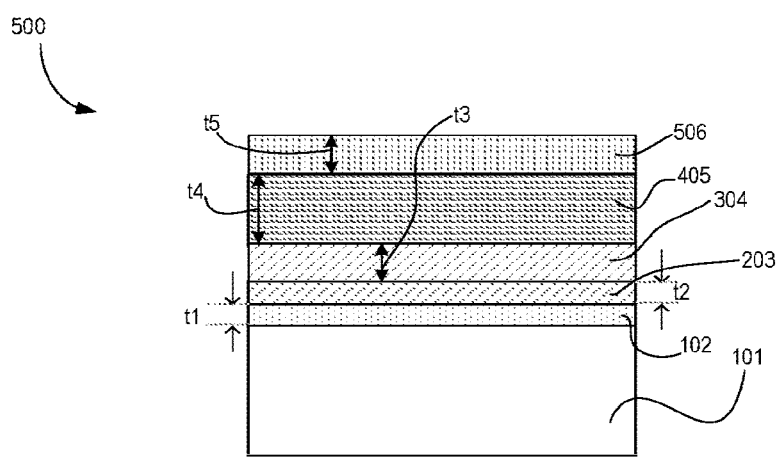
Figure 6:
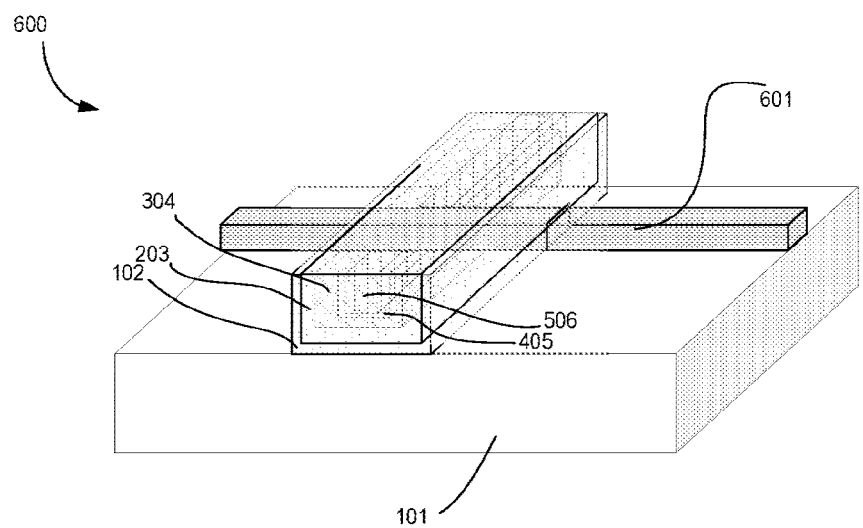
FIG. 6 illustrates a three-dimensional (3D) view of a fin field-effect ferroelectric transistor (fin FE-FET) comprising the ferroelectric stack of FIG. 5, in accordance with some embodiments.

FIG. 6 illustrates a three-dimensional (3D) view of a fin ferroelectric field-effect transistor (fin FE-FET) 600 comprising the ferroelectric stack of FIG. 5, in accordance with some embodiments. In some embodiments, the gate terminal of FET 600 is formed of layers described with reference to FIG. 5. For example, layers 102, 203, 304, 405, and 506 are used to form the gate terminal. In this example, a fin 601 is shown that passes through the gate. The FE stack of FIG. 5 can also be used for forming other types of transistors such as Tri-Gate transistors, Gate All Around Cylindrical Transistors, Tunneling FET (TFET), Square Wire, or Rectangular Ribbon Transistors, or other devices implementing transistor functionality like carbon nanotubes or spintronic devices.

Figure 7:
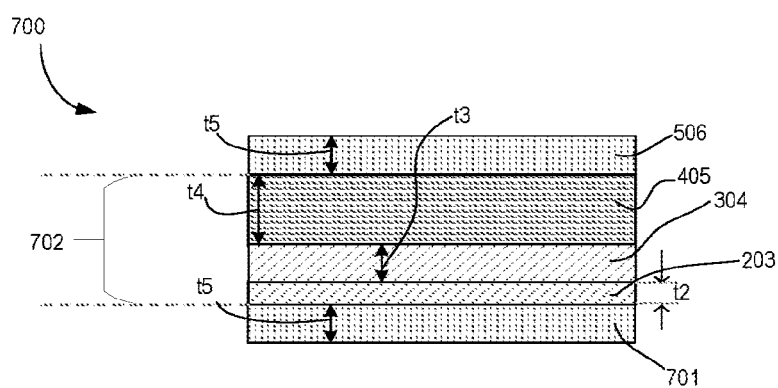
FIG. 7 illustrates a cross-section of a FE capacitor (FE-cap) comprising one or more layers shown in FIG. 5, according to some embodiments of the disclosure.

FIG. 7 illustrates cross-section 700 of a FE capacitor (FE-cap) comprising one or more layers shown in FIG. 5, according to some embodiments of the disclosure. Cross-section 700 is similar to cross-section 500 but for removal of semiconductor layer 101 and its surface/insulator 102. In some embodiments, metal layer 701 is provided which includes the same or similar material as metal layer 506 to form the other metal plate of the FE cap. Here, layers 702 form the capacitive material while metals 506 and 701 are the plates of the FE-cap.

In some embodiments, FE-cap 700 is formed in a backend stack of layers. Here, the term "backend" generally refers to a section of a die which is opposite of a "frontend" and where an IC (integrated circuit) package couples to IC die bumps. For example, high level metal layers (e.g., metal layer 6 and above in a ten metal stack die) and corresponding vias that are closer to a die package are considered part of the backend of the die. Conversely, the term "frontend" generally refers to a section of the die that includes the active region (e.g., where transistors are fabricated) and low level metal layers and corresponding vias that are closer to the active region (e.g., metal layer 5 and below in the ten metal stack die example).

In some embodiment, FE-Cap 700 is a super capacitor for charge storage. The term "super capacitor", "supercapacitor" and "ultracapacitor" are interchangeable terms. A super capacitor can be used for storing large amounts of charge for providing backup power, regeneration braking storage, peak power assist, and other types of charge/discharge functions.

Figure 8:
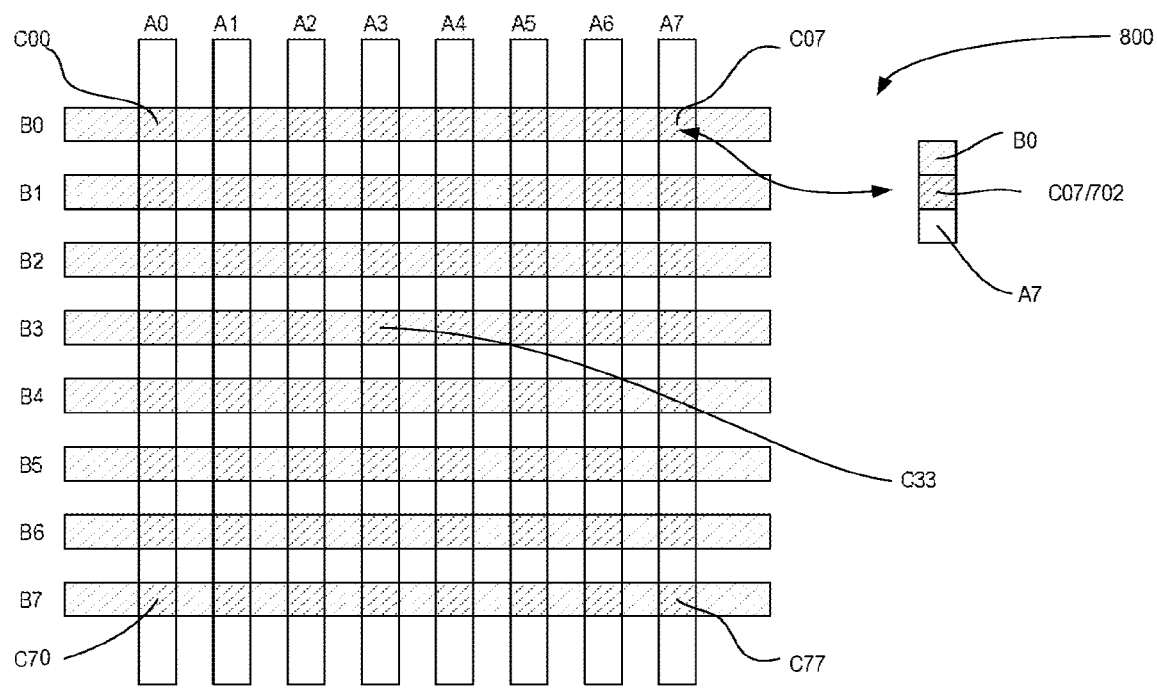
FIG. 8 illustrates an apparatus showing distributed metal-insulator-metal (MIM) capacitors comprising FE-caps, according to some embodiments of the disclosure.

FIG. 8 illustrates apparatus 800 showing distributed metal-insulator-metal (MIM) capacitors comprising FE-caps, according to some embodiments of the disclosure. Apparatus 800 illustrates a mesh of two layers with an FE-cap formed between the two layers. Here the first layer is layer B having parallel lines B0 through B7, and the second layer is layer A having parallel lines A0 through A7, where lines A0 through A7 are orthogonal to lines B0 through B7. In this example, 8 lines of layers A and B are shown. However, the disturbed capacitor of various embodiments can be formed with any number of lines of layers A and B.

In some embodiments, the first layer B with lines B0 through B7 is coupled to a power supply, thus forming power supply lines. In some embodiments, the second layer A with lines A0 through A7 is coupled to a ground supply, thus forming ground supply lines. The array of FE-caps here forms a distributed network of parallel capacitors, in accordance with some embodiments. In some embodiments, FE-caps C00 through C77 (not all are label for sake of brevity) are formed between the regions of lines A0 through A7 and B0 through B7. In some embodiments, the material between the metal lines from first and second layers are same as layers 702, where first layer B is same as metal layer 701 and where second layer A is same as metal layer 506. In some embodiments, the FE-caps are MIM capacitors.

In some embodiments, the array of FE-caps C00 through C77 is used for charge storage and switching in backend of a computing chip. In some embodiments, the array of FE-caps C00 through C77 is integrated with low voltage logic (e.g., spin logic, eDRAM, etc.) and is used to provide power to it. In some embodiments, the array of supercapacitors C00 through C77 provides power to frontend transistors (e.g., CMOS transistors).

FIG. 9A illustrates schematic 900 of a FE-Cap comprising one or more layers shown in FIG. 5, according to some embodiments of the disclosure. FIG. 9B illustrates a plot 920 showing charge versus voltage function of the FE-Cap comprising one or more layers shown in FIG. 5, and its memory states, according to some embodiments of the disclosure.

Unlike a normal dielectric based capacitor, a FE-cap uses polarization charge to store the memory states, where positive and negative polarization charge indicates state "1" or "0". To switch an FE-cap, the applied FE-cap voltage VA must be higher than the ferroelectric coercive voltages (which behave as threshold voltages) when driven by a voltage source. For example, VA>V+ for 0 to 1 switching, and VA<V− for 1 to 0 switching. A write driver for ferroelectric is typically based on voltage sources and these voltage sources may induce an imprint voltage on the ferroelectric capacitor due to additional charge deposition, even with VA=V+ for SET, VA=V− for RESET.

Figure 10:
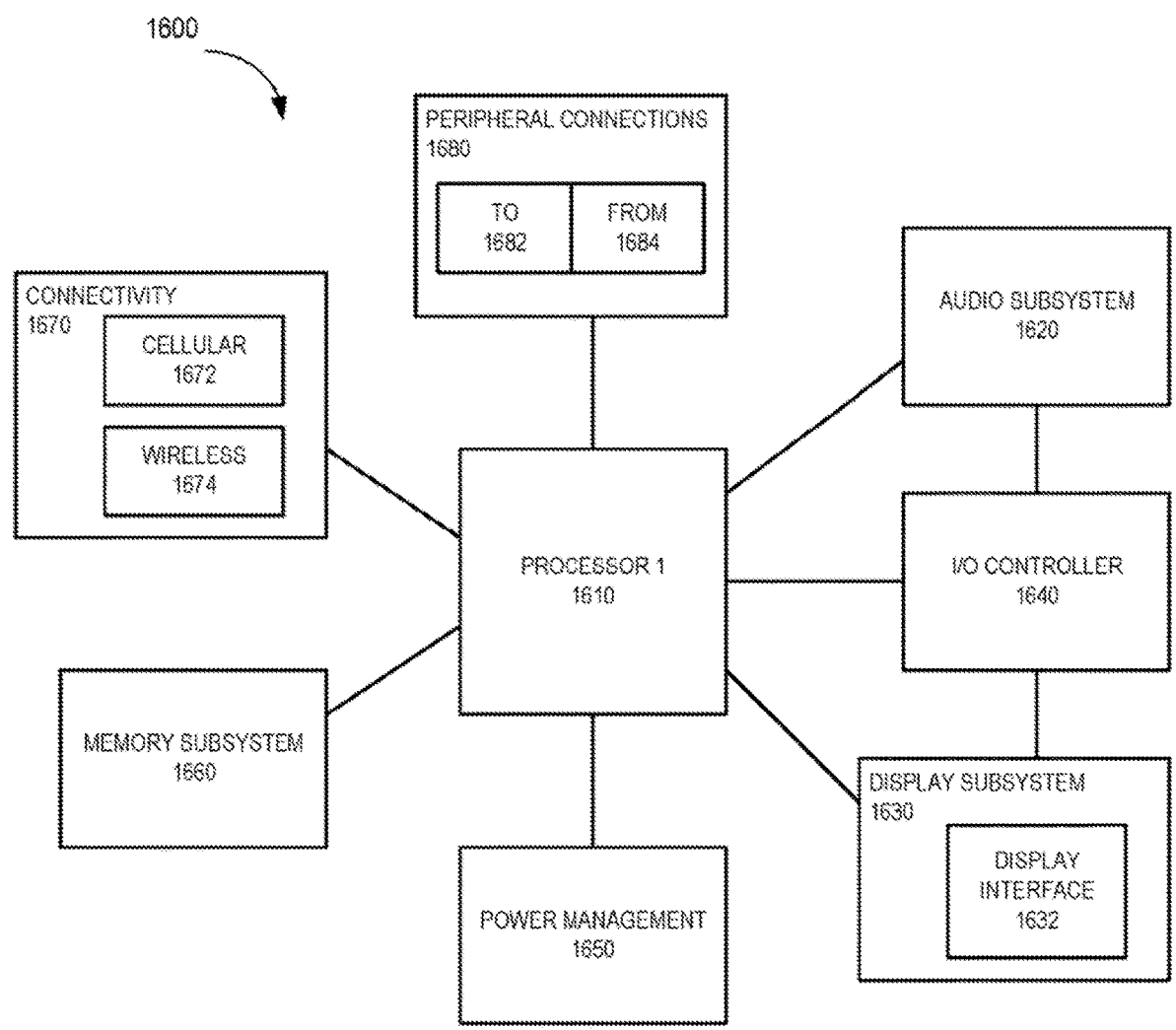
FIG. 10 illustrates a smart device or a computer system or a SoC (System-on-Chip) having a FE-cap and/or FE-FET, according to some embodiments.

FIG. 10 illustrates a smart device or a computer system or a SoC (System-on-Chip) having a FE-cap and/or FE-FET, according to some embodiments. The FE-cap and/or FE-FET of some embodiments can be used to charge any or all blocks of SoC 2100, in accordance with some embodiments.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 10 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600. In some embodiments, one or more blocks (even all blocks) may be powered using the super-capacitor.

In some embodiments, computing device 1600 includes first processor 1610 and network interface within 1670 such as a wireless interface so that a system embodiment may be incorporated into a wireless device, for example, cell phone or personal digital assistant. Any of the various blocks of computing device 1600 can have or use the super capacitor of various embodiments.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600. In some embodiments, Memory subsystem 1660 includes the scheme of analog in-memory pattern matching with the use of resistive memory elements. In some embodiments, memory subsystem includes the floating-gate transistor, according to some embodiments.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1. An apparatus comprising: a first layer comprising a semiconductor; a second layer comprising an insulating material, the second layer adjacent to the first layer; a third layer comprising a high-k insulating material, the third layer adjacent to the second layer; a fourth layer comprising a ferroelectric material, the fourth layer adjacent to the third layer; and a fifth layer comprising a high-k insulating material, the fifth layer adjacent to the fourth layer.

Example 2. The apparatus of example 1, wherein the semiconductor of the first layer includes or more of: boron, aluminum, gallium, indium, nitrogen, phosphorous, arsenic, antimony, or bismuth.

Example 3. The apparatus according to any one of the preceding examples, wherein the insulating material of the second layer includes one or more of: Si, O, N, or Ge.

Example 4. The apparatus of claim 1, wherein the insulating material of the second layer includes one or more of: SiO, silicon oxynitride, or GeO.

Example 5. The apparatus according to any one of the preceding examples, wherein the high-k insulating material of the third and fifth layers include one or more of: Hf, Al, Zr, La, or O.

Example 6. The apparatus of example 1, wherein the high-k insulating material of the third and fifth layers include one or more of: $HfO_2$, $Al_2O_3$, $ZrO_2$, or $La_2O_3$.

Example 7. The apparatus of example 1, wherein the ferroelectric material includes one or more of: $HfZrO_2$ (HZO), HfAlO, $BaTiO_3$ (BTO), barium strontium titanate (BST), $BiFeO_3$ (BFO), Si doped $HfO_2$, $PbTiO_3$ (PTO), $SrTiO_3$ (STO), $Pb[Zr_xTi_{(1-x)}]O_3$ (PZT) where x is less than or equal to 1 and greater or equal to 0, or lead lanthanum zirconate titanate (PLZT).

Example 8. The apparatus according to any one of the preceding examples, wherein the ferroelectric material includes one or more of: Hf, Zr, Ba, Bi, Ti, Pb, Sr, Zr, or La.

Example 9. The apparatus according to any one of the preceding examples comprises a sixth layer including a metal, wherein the sixth layer is adjacent to the fifth layer.

Example 10. The apparatus of example 10, wherein the metal of the first layer includes one or more of: Ta, Ti, Cu, Al, Au, Ag, W, Co, TiN, TaN, or Graphene.

Example 11. The apparatus according to any one of the preceding examples, wherein the second layer has a thickness in a range of 1 to 20 Angstroms.

Example 12. The apparatus according to any one of the preceding examples, wherein the third and fifth layers have a thickness in a range of 1 to 20 Angstroms.

Example 13. The apparatus according to any one of the preceding examples, wherein the fourth layers has a thickness in a range of 20 to 100 Angstroms.

Example 14. An apparatus comprising: a first layer comprising metal; a second layer comprising metal; and a plurality of layers coupled between the first and second metal layers, wherein the plurality of layers include: a third layer comprising a high-k insulating material, the third layer adjacent to the second layer; a fourth layer comprising a ferroelectric material, the fourth layer adjacent to the third layer; and a fifth layer comprising a high-k insulating material, the fifth layer adjacent to the fourth layer and the first layer.

Example 15. The apparatus of example 14, wherein the third and fifth layers have a thickness in a range of 1 to 20 Angstroms.

Example 16. The apparatus according to any one examples 14 or 15, wherein the fourth layers has a thickness in a range of 20 to 100 Angstroms.

Example 17. The apparatus according to any one examples 14 to 16, wherein the metal of the first and second layers include one or more of: Ti, Ta, N, Cu, Al, Au, Ag, W, Co, TiN, TaN, or Graphene.

Example 18. The apparatus according to any one examples 14 to 17, wherein the high-k insulating material of the third and fifth layers include one or more of: Hf, Al, Zr, La, or O.

Example 19. The apparatus according to any one examples 14 to 18, wherein the high-k insulating material of the third and fifth layers include one or more of: $HfO_2$, $Al_2O_3$, $ZrO_2$, or $La_2O_3$.

Example 20. The apparatus according to any one examples 14 to 19, wherein the ferroelectric material includes one or more of: Hf, Zr, Ba, Bi, Ti, Pb, Sr, Zr, or La.

Example 21. The apparatus of example 14, wherein the ferroelectric material includes one or more of: $HfZrO_2$ (HZO), HfAlO, $BaTiO_3$ (BTO), barium strontium titanate (BST), $BiFeO_3$ (BFO), Si doped $HfO_2$, $PbTiO_3$ (PTO), $SrTiO_3$ (STO), $Pb[Zr_xTi_{(1-x)}]O_3$ (PZT) where x is less than or equal to 1 and greater or equal to 0, or lead lanthanum zirconate titanate (PLZT).

Example 22. A system comprising: a memory; a processor coupled to the memory, the processor including a ferroelectric transistor which includes an apparatus according to any one of examples 1 to 13; and a wireless interface to allow the processor to communicate with another device.

Example 23. A system comprising: a memory; a processor coupled to the memory, the processor including a ferroelectric capacitor which includes an apparatus according to any one of examples 14 to 21; and a wireless interface to allow the processor to communicate with another device.

Example 24. A method comprising: forming a first layer comprising a semiconductor; forming a second layer comprising an insulating material, the second layer adjacent to the first layer; forming a third layer comprising a high-k insulating material, the third layer adjacent to the second layer; forming a fourth layer comprising a ferroelectric material, the fourth layer adjacent to the third layer; and forming a fifth layer comprising a high-k insulating material, the fifth layer adjacent to the fourth layer.

Example 25. The method of example 24, wherein the semiconductor of the first layer includes or more of: boron, aluminum, gallium, indium, nitrogen, phosphorous, arsenic, antimony, or bismuth.

Example 26. The method according to any one of the preceding method examples, wherein the insulating material of the second layer includes one or more of: Si, O, N, or Ge.

Example 27. The method of example 24, wherein the insulating material of the second layer includes one or more of: SiO, silicon oxynitride, or GeO.

Example 28. The method according to any one of the preceding method examples, wherein the high-k insulating material of the third and fifth layers include one or more of: Hf, Al, Zr, La, or O.

Example 29. The method of example 24, wherein the high-k insulating material of the third and fifth layers include one or more of: $HfO_2$, $Al_2O_3$, $ZrO_2$, or $La_2O_3$.

Example 30. The method of example 24, wherein the ferroelectric material includes one or more of: $HfZrO_2$ (HZO), HfAlO, $BaTiO_3$ (BTO), barium strontium titanate (BST), $BiFeO_3$ (BFO), Si doped $HfO_2$, $PbTiO_3$ (PTO), $SrTiO_3$ (STO), $Pb[Zr_xTi_{(1-x)}]O_3$ (PZT) where x is less than or equal to 1 and greater or equal to 0, or lead lanthanum zirconate titanate (PLZT).

Example 31. The method according to any one of the preceding method examples, wherein the ferroelectric material includes one or more of: Hf, Zr, Ba, Bi, Ti, Pb, Sr, Zr, or La.

Example 32. The method according to any one of the preceding method examples comprises a sixth layer including a metal, wherein the sixth layer is adjacent to the fifth layer.

Example 33. The method of example 10, wherein the metal of the first layer includes one or more of: Cu, Al, Au, Ag, W, Co, TiN, TaN, Ta, or Graphene.

Example 34. The method according to any one of the preceding examples, wherein the second layer has a thickness in a range of 1 to 20 Angstroms.

Example 35. The method according to any one of the preceding examples, wherein the third and fifth layers have a thickness in a range of 1 to 20 Angstroms.

Example 36. The method according to any one of the preceding examples, wherein the fourth layers has a thickness in a range of 20 to 100 Angstroms.

Example 37. A method comprising: forming a first layer comprising metal; forming a second layer comprising metal; and forming a plurality of layers coupled between the first and second metal layers, wherein forming the plurality of layers include: forming a third layer comprising a high-k insulating material, the third layer adjacent to the second layer; forming a fourth layer comprising a ferroelectric material, the fourth layer adjacent to the third layer; and forming a fifth layer comprising a high-k insulating material, the fifth layer adjacent to the fourth layer and the first layer.

Example 38. The method of example 37, wherein the third and fifth layers have a thickness in a range of 1 to 20 Angstroms.

Example 39. The method according to any one examples 37 or 38, wherein the fourth layers has a thickness in a range of 20 to 100 Angstroms.

Example 40. The method according to any one examples 37 to 39, wherein the metal of the first and second layers include one or more of: Ta, Cu, Al, Au, Ag, W, Co, TiN, TaN, or Graphene.

Example 41. The method according to any one examples 37 to 40, wherein the high-k insulating material of the third and fifth layers include one or more of: Hf, Al, Zr, La, or O.

Example 42. The method according to any one examples 37 to 41 wherein the high-k insulating material of the third and fifth layers include one or more of: $HfO_2$, $Al_2O_3$, $ZrO_2$, or $La_2O_3$.

Example 43. The method according to any one examples 37 to 42, wherein the ferroelectric material includes one or more of: Hf, Zr, Ba, Bi, Ti, Pb, Sr, Zr, or La.

Example 44. The method of example 43, wherein the ferroelectric material includes one or more of: $HfZrO_2$ (HZO), HfAlO, $BaTiO_3$ (BTO), barium strontium titanate (BST), $BiFeO_3$ (BFO), Si doped $HfO_2$, $PbTiO_3$ (PTO), $SrTiO_3$ (STO), $Pb[Zr_xTi_{(1-x)}]O_3$ (PZT) where x is less than or equal to 1 and greater or equal to 0, or lead lanthanum zirconate titanate (PLZT).

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit comprising:
   a first layer comprising a high-k insulative material;
   a second layer comprising a ferroelectric material, the second layer adjacent to the first layer; and
   a third layer comprising a high-k insulative material, the third layer connected to the second layer having a thickness of not more than 20 Angstroms;
   a fourth layer comprising a metal, the fourth layer connected to the third layer.

2. The integrated circuit of claim 1, comprising:
   a semiconductor region below the first layer, the semiconductor region including one or more of boron, aluminum, gallium, indium, nitrogen, phosphorous, arsenic, antimony, or bismuth; and
   an insulator region between the semiconductor region and the first layer, the insulator region including an oxide.

3. The integrated circuit according to claim 1, wherein the high-k insulative material of the first layer includes one or more of hafnium, aluminum, zirconium, lanthanum, or oxygen, and wherein the high-k insulative material of the third layer includes one or more of hafnium, aluminum, zirconium, lanthanum, or oxygen.

4. The integrated circuit of claim 1, wherein the high-k insulating material of the first layer includes one or more of hafnium oxide, aluminum oxide, zirconium oxide, or lanthanum oxide, and wherein the high-k insulating material of the third layer includes one or more of hafnium oxide, aluminum oxide, zirconium oxide, or lanthanum oxide.

5. The integrated circuit of claim 1, wherein the ferroelectric material includes one or more of: hafnium zirconium oxide (HZO); hafnium aluminum oxide; barium titanate (BTO); barium strontium titanate (BST); bismuth ferrite (BFO); silicon doped hafnium oxide; lead titanate (PTO); strontium titanate (STO); lead zirconate titanate (Pb[ZrxTi(1−x)]O3) (PZT) where x is less than or equal to 1 and greater than or equal to 0; or lead lanthanum zirconate titanate (PLZT).

6. The integrated circuit of claim 1, wherein the ferroelectric material includes one or more of: hafnium, zirconium, barium, bismuth, titanium, lead, strontium, zirconium, or lanthanum.

7. The integrated circuit of claim 1, wherein the metal of the fourth layer includes one or more of: tantalum, titanium, copper, aluminum, gold, silver, tungsten, cobalt, titanium nitride, tantalum nitride, or Graphene.

8. The integrated circuit of claim 1, wherein the second layer has a thickness in a range of 20 to 100 Angstroms.

9. The integrated circuit of claim 1, wherein the first layer has a thickness in a range of 1 to 20 Angstroms.

10. The integrated circuit of claim 1, further comprising a fifth layer adjacent to the first layer, the fifth layer comprising an insulative material.

11. The integrated circuit of claim 10, wherein the fifth layer has a thickness in a range of 1 to 20 Angstroms.

12. The integrated circuit of claim 1, wherein the first layer, second layer, third layer, and fourth layer are at least part of a capacitor structure.

13. A metal insulator metal (MIM) capacitor comprising:
a first layer comprising metal;
a second layer comprising metal; and
a plurality of layers coupled between the first and second layers, wherein the plurality of layers include
a third layer comprising a high-k insulative material,
a fourth layer comprising a ferroelectric material, the fourth layer adjacent to the third layer, and
a fifth layer comprising a high-k insulative material, the fifth layer connected to the fourth layer, and the fifth layer having a thickness of not more than 20 Angstroms.

14. The metal insulator metal (MIM) capacitor of claim 13, wherein the third layer has a thickness in a range of 1 to 20 Angstroms, and wherein the fifth layer has a thickness in a range of 1 to 20 Angstroms, and wherein the fourth layer has a thickness in a range of 20 to 100 Angstroms.

15. The metal insulator metal (MIM) capacitor of claim 13, wherein the metal of the first layer includes one or more of tantalum, titanium, copper, aluminum, gold, silver, tungsten, cobalt, titanium nitride, tantalum nitride, or Graphene, and wherein the metal of the second layer includes one or more of tantalum, titanium, copper, aluminum, gold, silver, tungsten, cobalt, titanium nitride, tantalum nitride, or Graphene.

16. The metal insulator metal (MIM) capacitor of claim 13, wherein the high-k insulating material of the third layer includes one or more of hafnium, aluminum, zirconium, lanthanum, or oxygen, and wherein the high-k insulating material of the fifth layer includes one or more of hafnium, aluminum, zirconium, lanthanum, or oxygen.

17. The metal insulator metal (MIM) capacitor of claim 13, wherein the high-k insulating material of the third layer includes one or more of hafnium oxide, aluminum oxide, zirconium oxide, or lanthanum oxide, and wherein the high-k insulating material of the fifth layer includes one or more of hafnium oxide, aluminum oxide, zirconium oxide, or lanthanum oxide.

18. The metal insulator metal (MIM) capacitor of claim 13, wherein the ferroelectric material of the fourth layer includes one or more of: hafnium, zirconium, barium, bismuth, titanium, lead, strontium, zirconium, or lanthanum.

19. An integrated circuit comprising:
a first layer comprising a high-k insulative material that includes oxygen and one or more of hafnium, aluminum, zirconium, or lanthanum, the first layer having a thickness in a range of 1 to 20 Angstroms;
a second layer comprising a ferroelectric material, the second layer adjacent to the first layer; and
a third layer comprising a high-k insulative material that includes oxygen and one or more of hafnium, aluminum, zirconium, or lanthanum, the third layer connected to the second layer and having a thickness in a range of 1 to 20 Angstroms;
a fourth layer comprising a metal, the fourth layer connected to the third layer.

20. The integrated circuit of claim 19, wherein the ferroelectric material includes one or more of: hafnium, zirconium, barium, bismuth, titanium, lead, strontium, zirconium, or lanthanum, the integrated circuit comprising:
a semiconductor region below the first layer, the semiconductor region including one or more of boron, aluminum, gallium, indium, nitrogen, phosphorous, arsenic, antimony, or bismuth; and
an insulator region between the semiconductor region and the first layer, the insulator region including an oxide.

* * * * *